US006999178B2

United States Patent
Hanson et al.

(10) Patent No.: US 6,999,178 B2
(45) Date of Patent: *Feb. 14, 2006

(54) SPATIAL-HETERODYNE INTERFEROMETRY FOR REFLECTION AND TRANSMISSION (SHIRT) MEASUREMENTS

(75) Inventors: Gregory R. Hanson, Clinton, TN (US); Philip R. Bingham, Knoxville, TN (US); Ken W. Tobin, Harriman, TN (US)

(73) Assignee: UT-Battelle LLC, Oak Ridge, TN (US)

( * ) Notice: Subject to any disclaimer, the term of this patent is extended or adjusted under 35 U.S.C. 154(b) by 126 days.

This patent is subject to a terminal disclaimer.

(21) Appl. No.: 10/649,474

(22) Filed: Aug. 26, 2003

(65) Prior Publication Data

US 2005/0046858 A1 Mar. 3, 2005

(51) Int. Cl.
*G01B 9/02* (2006.01)
(52) U.S. Cl. ...................................... 356/484; 356/489
(58) Field of Classification Search ................ 356/457, 356/458, 485, 489, 484
See application file for complete search history.

(56) References Cited

U.S. PATENT DOCUMENTS

| | | | |
|---|---|---|---|
| 4,812,042 A | 3/1989 | Yokokura et al. | |
| 5,299,035 A | 3/1994 | Leith et al. | |
| 5,339,152 A | 8/1994 | Horn | |
| 5,410,397 A | 4/1995 | Toeppen | |
| 5,515,183 A | 5/1996 | Hashimoto | |
| 5,671,042 A | 9/1997 | Sciammarella | |
| 5,877,873 A | 3/1999 | Bashaw et al. | |
| 5,995,251 A | 11/1999 | Hesselink et al. | |
| 6,078,392 A * | 6/2000 | Thomas et al. | 356/457 |
| 6,262,818 B1 | 7/2001 | Cuche et al. | |
| 6,525,821 B1 * | 2/2003 | Thomas et al. | 356/457 |
| 6,597,446 B1 | 7/2003 | Klooster et al. | |
| 6,747,771 B1 * | 6/2004 | Thomas et al. | 359/32 |
| 6,809,845 B1 | 10/2004 | Kim et al. | |
| 2003/0016364 A1 * | 1/2003 | Thomas et al. | 356/457 |

(Continued)

FOREIGN PATENT DOCUMENTS

JP 06282213 7/1994

(Continued)

OTHER PUBLICATIONS

International Search Report and Written Opinion, PCT/US2004/027766, Feb. 2, 2005.

(Continued)

*Primary Examiner*—Zandra V. Smith
*Assistant Examiner*—Patrick Connolly
(74) *Attorney, Agent, or Firm*—John Bruckner PC

(57) ABSTRACT

Systems and methods are described for spatial-heterodyne interferometry for reflection and transmission (SHIRT) measurements. A method includes digitally recording a first spatially-heterodyned hologram using a first reference beam and a first object beam; digitally recording a second spatially-heterodyned hologram using a second reference beam and a second object beam; Fourier analyzing the digitally recorded first spatially-heterodyned hologram to define a first analyzed image; Fourier analyzing the digitally recorded second spatially-heterodyned hologram to define a second analyzed image; digitally filtering the first analyzed image to define a first result; and digitally filtering the second analyzed image to define a second result; performing a first inverse Fourier transform on the first result, and performing a second inverse Fourier transform on the second result. The first object beam is transmitted through an object that is at least partially translucent, and the second object beam is reflected from the object.

26 Claims, 7 Drawing Sheets

U.S. PATENT DOCUMENTS

| | | | |
|---|---|---|---|
| 2003/0227658 A1* | 12/2003 | Thomas et al. | 359/35 |
| 2004/0021871 A1 | 2/2004 | Psaltis et al. | |
| 2004/0042015 A1* | 3/2004 | Price | 356/484 |
| 2004/0042056 A1* | 3/2004 | Price et al. | 359/29 |
| 2004/0042057 A1* | 3/2004 | Thomas et al. | 359/32 |
| 2004/0057089 A1* | 3/2004 | Voelkl | 359/1 |
| 2004/0130762 A1* | 7/2004 | Thomas et al. | 359/15 |
| 2004/0145745 A1* | 7/2004 | Voelkl | 356/458 |
| 2004/0212807 A1* | 10/2004 | Hanson et al. | 356/458 |
| 2004/0213462 A1* | 10/2004 | Hanson et al. | 382/210 |
| 2004/0213464 A1* | 10/2004 | Hanson et al. | 382/214 |
| 2005/0046857 A1* | 3/2005 | Bingham et al. | 356/457 |
| 2005/0046858 A1* | 3/2005 | Hanson et al. | 356/457 |

FOREIGN PATENT DOCUMENTS

| | | |
|---|---|---|
| WO | WO 01/50201 A | 7/2001 |
| WO | WO 03/048868 A | 6/2003 |

OTHER PUBLICATIONS

Thomas C. E., et al. "Direct to digital holography for high aspect ratio inspection of semiconductor wafers" AIP Conference Proceedings, American Institute of Physics, New York, NY, US, No. 683, Mar. 24, 2003, pp. 254-270.

Cuche E., et al. Simultaneous amplitude-contrast and quantitative phase-contrast microscopy by numberical reconstruction of Fresnel off-axis holograms: Applied Optics, Optical Society of America USA, vol. 38, No. 34, Dec. 1, 1999, pp. 6994-7001.

Cuche E., et al. "Spatial filtering for zero-order and twin-image elimination in digital off-axis holography" Applied Optics, Optical Society of America USA, vol. 39, No. 23, Aug. 10, 2000, pp. 4070-4075.

International Search Report and Written Opinion, PCT/US2004/027749, Feb. 2, 2005.

Cuche E., et al. "Digital holography for quantitative phase-contrast imaging" Optical Letter, Optical Society of America, Washington, USA, vol. 24, No. 5, Mar. 1, 1999, pp. 291-293.

Schnars U., "Direct phase determination in hologram interferometry with use of digitally recorded holograms" Journal of the Optical Society of America—A, Optical Cociety of America, Washington, US, vol. 11, No. 7, Jul. 1, 1994, pp. 2011-2015.

Edgar Volkl, "Introduction to Electron Holography", pp. 133-138, published by Kluwer Academic/Plenum Publishers, New York, 1999.

Jacob et al., "High Resolution Photomask Transmission and Phase Measurement Tool", Metrology, Inspection and Process Control for Microlithography XVI, Proceedings of SPIE vol. 4689, pp. 70-82, 2002.

Thomas et al., "Direct to Digital Holography for Semiconductor Wafer Defect Detection and Review", Design, Process Integration, and Characterization for Microelectronics, Proceedings of SPIE vol. 4692, pp. 180-194, 2002.

"Phase Contrast Microscopy" Authors unknown, date unknown.

Invention of Holography: D. Gabor, Proc. Roy. Soc. London Ser. A *A197*, 459 (1949).

Invention of Sideband (Hetrodyne) Holography: E. Leith and J. Upatnieks, J. Opt. Soc. Am. 52, 1123 (1962) and J. Opt. Soc. Am. 53 1377 (1963).

Mathematical Treatise on Holography: J.B. Develis and G.O. Reynolds, Theory and Application of Holography, Addison-Wesley, Reading, MA, 1967.

Holographic Interferometry: L.O. Heflinger, R.F. Wuerker, and R.E. Brooks, J. Appl. Phys. 37, 642 (1966).

Discussion of Focused Holography (used for holographic interferometry): F.E. Jahoda, R.A. Jeffries and G.A. Sawyer, Appln. Opt. 6, 1407 (1967).

Interferogram Analysis: Digital Fringe Pattern Measurement Techniques, M. Kujawinska, (edited by D.W. Robinson and G.T. Reid), IOP Publishing Ltd., Bristol, England, 1993).

Holographic Interferometry: Principles and Methods, K. Creath and T. Kreis (edited by K. Rastogi), Springer-Verlag, New York, New York, 1994.

Papers by E. Voelkl on Fourier transform analysis of electron holography: E. Voelkl, L.F. Allard, and B. Frost, J. Microscopy 180, pt. 1, Oct., 1995, pp. 39-50.

E. Voelkl, L.F. Allard, A. Datye, B. Frost, Ultramicroscopy 58, (1995), pp. 97-103.

E. Voelkl, L.F. Allard, ICEM-13 (13th International Conference on Electron Microscopy), Jul. 17-22, 1994, Paris, France, Proceedings, p. 287.

Volkl, E., et al. "Advanced Electron Holography: A New Algorithm for Image Processing and Standardized Quality Test for the FEG Electron Microscope", Ultramicroscopy 58 (1995) 97-103.

Volkl, E., et al., "A Software Package for the Processing and Reconstruction of Electron Holograms", Journal of Microscopy, vol. 180, pt. 1, Oct., 1995, pp. 39-50.

Leith, E.N. "Reconstructed Wavefronts and Communication Theory", Journal of Optical Society of America, vol. 52 No. 10, Oct. 1962.

Gabor, D., et al., "Microscopy by Reconstructed Wave-Fronts", Research Laboratory, Aug. 1948, pp. 454-487.

Leith, E.N., et al., "Wavefront Reconstruction with Continuous-Tone Objects", Journal of the Optical Society of America, vol. 53, No. 12, Dec. 1963.

Leith, E.N., et al., "Wavefront Reconstruction with Diffused Illumination and Three Dimensional Objects", Journal of the Optical Society of America, vol. 54, No. 11, Nov. 1964.

North, J.C., et al., "Holographic Interferometry", Journal of Applied Physics, vol. 37, No. 2, Feb. 1966.

Kujawinska, M., "Digital Fringe Pattern Measurement Techniques", Interferogram Analysis.

DeVelis, J.B., et al., "Theory and Applications of Holography", (1967).

Jahoda, F.C., et al., "Fractional-Fringe Holographic Plasma Interferometry", Applied Optics, Aug. 1967, vol. 6, No. 8, pp. 1407-1410.

Jahoda, F.C., et al., "Holographic Interferometry Cookbook", Los Alamos Scientific Laboratory, Oct. 1972.

Rastogi, P.K., "Holographic Interferometry", Optical Science Center, University of Arizona, vol. 68 (1994).

Volkl, E., et al., "The Extended Fourier Algorithm. Application in Discrete Optics and Electron Holography", High Temperature Materials Laboratory, Jul. 1994.

* cited by examiner

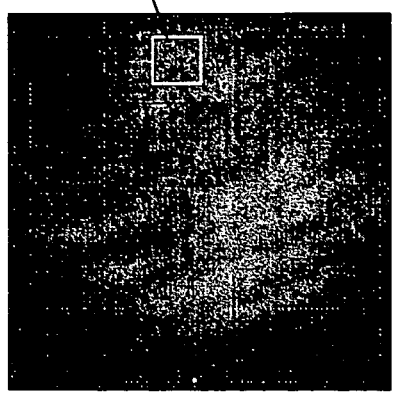 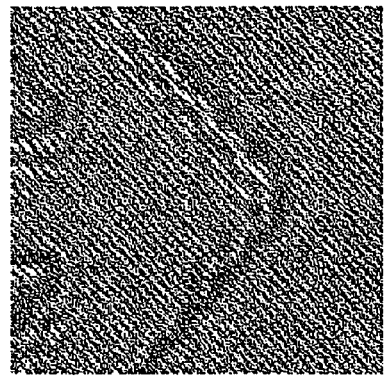
FIG. 1A             FIG. 1B
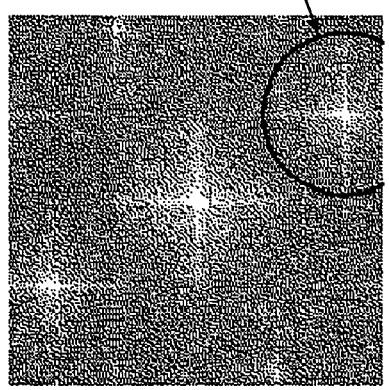 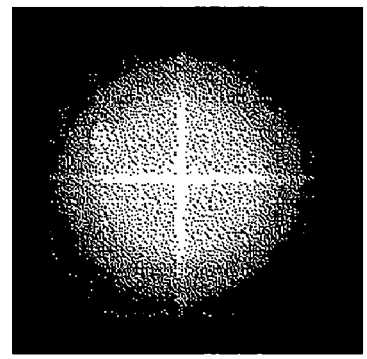
FIG. 2A             FIG. 2B
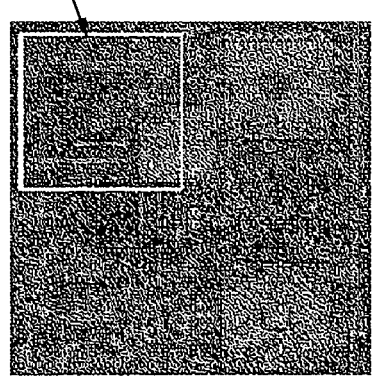 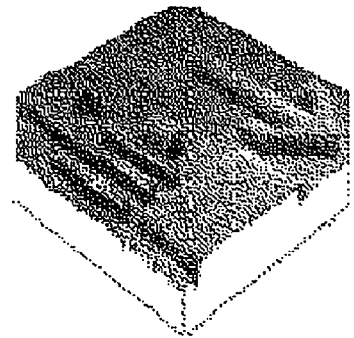
FIG. 3A             FIG. 3B

SPATIAL-HETERODYNE INTERFEROMETRY FOR REFLECTION AND TRANSMISSION (SHIRT) MEASUREMENTS

STATEMENT AS TO RIGHTS TO INVENTION MADE UNDER FEDERALLY-SPONSORED RESEARCH OR DEVELOPMENT

This invention was made with United States Government support under prime contract No. DE-AC05-00OR22725 to UT-Battelle, L.L.C. awarded by the Department of Energy. The Government has certain rights in this invention.

BACKGROUND OF THE INVENTION

1. Field of the Invention

The invention relates generally to the field of spatial-heterodyne interferometry (SHI). More particularly, the invention relates to methods and machinery for obtaining spatial-heterodyne interferometry for transmission (SHIFT) and spatial-heterodyne interferometry for reflection and transmission (SHIRT) measurements.

2. Discussion of the Related Art

U.S. Pat. Nos. 6,078,392 and 6,525,821 relate to Direct-to-Digital Holography (DDH). In DDH, a reflected object wavefront is combined with a reference wavefront at a small angle on the surface of a digital imaging device. The small angle generates a set of linear fringes that spatially heterodynes the reflected object wavefront. Fourier analysis is then used to isolate the image at the heterodyne frequency and reconstruct the complex wavefront, Voelkl (1999).

DDH is an implementation of spatial-heterodyne interferometry with Fourier reconstruction to capture complex wavefronts reflected from the surface of an object. When a wavefront strikes the surface of an object, the shape of the surface is imbedded in the phase of the wavefront and the reflectivities of the surface are contained in the intensity of the reflected wave. This reflected wave is combined with a reference wave at the digital imaging device so that they interfere and create a set of linear interference fringes. These linear interference fringes then contain the phase and amplitude information of the object wave. In Fourier space, this object wave information shows up centered around the spatial-frequency of the fringes. The recording of a wave's phase and amplitude information at a nonzero frequency is known as "heterodyning."

However, DDH does not provide information regarding the interior of an object of interest and only provides information regarding the surface of the object.

Meanwhile, phase contrast microscopy (PCM) is a well known technique that is commonly used to image biological specimens. PCM is particularly useful when a biological sample includes phase differentiable features that are of similar transmissibility. However, a limitation of PCM is that no complex wavefront information is provided, the phase information from PCM being represented by amplitude only.

Recently, Jacob (2002) reported a technique in which transmission phase shift interferometry is used to measure phase differences between two points on a photolithographic mask. While this technique is able to measure phase changes, 30 seconds are required for each height measurement and, therefore, a slow scan would be required to measure phase changes across an interior portion of an object and a very long scan would be required to measure phase changes over an entire mask. Therefore, what is needed is an approach that can quickly provide complex wavefront information regarding an interior portion of an object.

Heretofore, the requirements of both providing complex wavefront information regarding an interior portion of an object and providing that information quickly have not been met. What is needed is a solution that simultaneously solves both of these problems.

SUMMARY OF THE INVENTION

There is a need for the following aspects of the invention. Of course, the invention is not limited to these aspects.

According to an aspect of the invention, a process comprises: digitally recording a spatially-heterodyned hologram including spatial heterodyne fringes for Fourier analysis using a reference beam and an object beam; Fourier analyzing the digitally recorded spatially-heterodyned hologram, by shifting an original origin of the digitally recorded spatially-heterodyned hologram to sit on top of a spatial-heterodyne carrier frequency defined by an angle between the reference beam and the object beam, to define an analyzed image; digitally filtering the analyzed image to cut off signals around the original origin to define a result; and performing an inverse Fourier transform on the result, wherein the object beam is transmitted through an object that is at least partially translucent. According to another aspect of the invention, a machine comprises: a source of coherent light energy; a reference beam subassembly optically coupled to the source of coherent light; an object beam subassembly optically coupled to the source of coherent light; a beamsplitter optically coupled to both the reference beam subassembly and the object beam subassembly; and a pixilated detection device optically coupled to the beamsplitter, wherein the object beam subassembly includes an object that is at least partially translucent, the object transmissively optically coupled between the source of coherent light energy and the beamsplitter.

According to another aspect of the invention, a process comprises: digitally recording a first spatially-heterodyned hologram including spatial heterodyne fringes for Fourier analysis using a first reference beam and a first object beam; digitally recording a second spatially-heterodyned hologram including spatial heterodyne fringes for Fourier analysis using a second reference beam and a second object beam; Fourier analyzing the digitally recorded first spatially-heterodyned hologram, by shifting a first original origin of the digitally recorded first spatially-heterodyned hologram to sit on top of a first spatial-heterodyne carrier frequency defined by a first angle between the first reference beam and the first object beam, to define a first analyzed image; Fourier analyzing the digitally recorded second spatially-heterodyned hologram, by shifting a second original origin of the digitally recorded second spatially-heterodyned hologram to sit on top of a second spatial-heterodyne carrier frequency defined by a second angle between the second reference beam and the second object beam, to define a second analyzed image; digitally filtering the first analyzed image to cut off signals around the first original origin to define a first result; and digitally filtering the second analyzed image to cut off signals around the second original origin to define a second result; performing a first inverse Fourier transform on the first result, and performing a second inverse Fourier transform on the second result, wherein the first object beam is transmitted through an object that is at least partially translucent and the second object beam is reflected from the object. According to another aspect of the invention, a machine comprises: a source of coherent light energy; a transmission reference beam subassembly optically coupled to the source of coherent light; a reflection reference beam subassembly optically coupled to the source of coherent light; an object beam subassembly optically coupled to the source of coherent light, the object beam subassembly including a transmission object beam path and a reflection object beam path; a transmission beamsplitter optically coupled to both the transmission reference beam subassembly and the object beam subassembly; a reflection beamsplitter optically coupled to both the reflection reference beam subassembly and the object beam subassembly; and a pixilated detection device optically coupled to at least one member selected from the group consisting of the transmission beamsplitter and the reflection beamsplitter, wherein the object beam subassembly includes an object that is at least partially translucent, the object i) transmissively optically coupled between the source of coherent light energy and the transmission beamsplitter and ii) reflectively optically coupled between the source of coherent light energy and the reflection beamsplitter.

These, and other, aspects of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein identical reference numerals (if they occur in more than one view) designate the same elements. The invention may be better understood by reference to one or more of these drawings in combination with the description presented herein. It should be noted that the features illustrated in the drawings are not necessarily drawn to scale.

FIGS. 1A–1B illustrate an example of an intensity hologram formed on a CCD (charge coupled device) sensor from a chrome-on-glass target where FIG. 1B is an enlarged region showing the linear sinusoidal fringe pattern modulated by the surface topology and material characteristics, representing an embodiment of the invention.

FIGS. 2A–2B illustrate (FIG. 2A) the magnitude of the full frequency spectrum of a hologram and (FIG. 2B) the centered and low-pass filtered side-band of the hologram, representing an embodiment of the invention.

FIGS. 3A and 3B illustrate (FIG. 3A) the resultant amplitude of a portion of the chrome-on-glass target and (FIG. 3B) the phase reconstruction of the portion of the chrome-on-glass target, representing an embodiment of the invention.

DESCRIPTION OF PREFERRED EMBODIMENTS

Figure 4A:
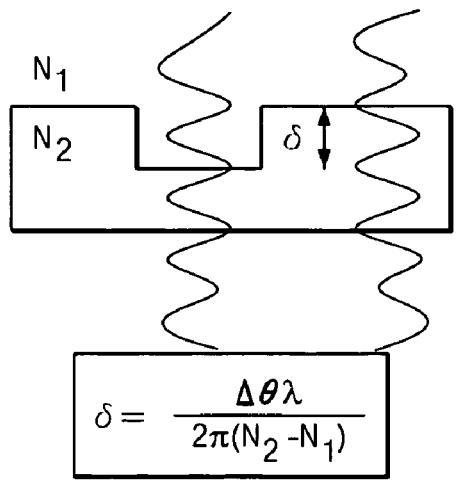
FIGS. 4A–4C illustrate schematic views of three transmission examples showing (FIG. 4A) the calculation of thickness given indices of refraction (FIG. 4B) the phase between different materials of same thickness and (FIG. 4C) the ability to calculate index of refraction for a material of known thickness, representing embodiments of the invention.

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by principal author's name followed by year of publication within parentheses. Full citations for these, and other, publications may be found at the end of the specification immediately preceding the claims after the section heading References. The disclosures of all these publications in their entireties are hereby expressly incorporated by reference herein for the purpose of indicating the background of the invention and illustrating the state of the art.

The below-referenced U.S. patents and U.S. patent applications disclose embodiments that are useful for the purposes for which they are intended. The entire contents of U.S. Pat. No. 6,078,392 issued Jun. 20, 2000, entitled "Direct-To-Digital Holography, Holographic Interferometry, and Holovision" to Clarence E. Thomas, Larry R. Baylor, Gregory R. Hanson, David A. Rasmussen, Edgar Voelkl, James Castracane, Michele Sumkulet and Lawrence Glow are hereby expressly incorporated by reference herein for all purposes. The entire contents of U.S. Pat. No. 6,525,821, issued Feb. 25, 2003, entitled "Acquisition and Replay Systems for Direct-to-Digital Holography and Holovision" to Clarence E. Thomas and Gregory R. Hanson are hereby expressly incorporated by reference herein for all purposes. The entire contents of U.S. Ser. Nos. 10/234,042; 10/234,043; 10/234,044; 10/349,579; 10/421,444; 10/607,824; and 10/607,840 are hereby expressly incorporated by reference herein for all purposes. The instant application contains disclosure that is also contained in copending U.S. Ser. No. 10/649,251, filed on the same day as the instant application, the entire contents of which are hereby expressly incorporated by reference for all purposes.

Overview

The process of spatial heterodyne hologram image formation can be adequately described using scalar diffraction theory, where the reference wavefront, $U_R(x,y)$ and the object wavefront, $U_O(x,y)$, are described as, $$U_R(x,y)=A_R(x,y)e^{-j\psi(x,y)} \text{ and } U_o(x,y)=A_o(x,y) e^{-j\phi(x,y)}.$$

For simplicity, it can be assumed that the reference wave is planar with a phase of 0 and the intensity is a constant, so $U_R(x,y)=A_R$. For spatial-heterodyne holography (SHH) creation, the reference wavefront is tilted at angles in x ($\theta_x$) and y ($\theta_y$) with respect to the object wavefront. When the two wavefronts are combined on the surface of a intensity measurement device (e.g., film, pixilated detection device, charged coupled device (CCD) camera, complimentary metal oxide silicon (CMOS) imager, etc.), the resulting intensity is $$I(x, y) = |A_O(x, y)|^2 + |A_R|^2 + 2 A_o(x, y) A_R \cos\left(\phi(x, y) - \frac{2\pi}{\lambda}(\theta_x x + \theta_y y)\right),$$

where $\lambda$ is the illumination wavelength. Thus, the recorded image not only contains the intensity of the two waves, but also the relative phase between the two waves. The angles between the two waves sets up (defines) the carrier frequency of the system and facilitates a recovery of the amplitude, $A_O(x,y)$ and the phase, $\phi(x,y)$, by using a Fourier frequency analysis method that will be described below.

FIGS. 1A and 1B depict an example of a recorded spatial-heterodyne hologram of a chrome-on-glass target. The inset in FIG. 1B shows the linear sinusoid patterns of fringes represented by ($\theta_x/\lambda$, $\theta_y/\lambda$) as modulated by the surface structure, which is a function of the phase, $\phi(x,y)$.

Once a spatial-heterodyne hologram has been formed on the surface of the CCD and transferred to the computer as a data matrix of scalar values, a goal is to recover the amplitude and phase of the object wave from this data matrix of scalar values. This can be accomplished computationally by taking the Fourier transform of the hologram and isolating one of the side-band structures in the complex spectrum. The localized side-band structure is a result of the preponderance of linear fringes across the image and cosine function in the hologram. The transform of the hologram results in the positioning of the complex wavefront information about a discrete point at frequency location ($\theta_x/\lambda$, $\theta_y/\lambda$) in the Fourier domain. This location is shifted to the origin of the frequency domain and selected using a low-pass filter to give a function $U_F(u,v)$ where, $$\mathfrak{I}\{U_F(x, y)\} = \mathfrak{I}\left\{\begin{bmatrix} [A_R + A_o(x, y)^2 + \\ 2A_R A_O(x, y)\cos \\ \left(\frac{2\pi}{\lambda}(\theta_x x + \theta_y y) + \phi(x, y)\right) \end{bmatrix} e^{-\frac{2\pi}{\lambda}j(\theta_x x + \theta_y y)}\right\} W_B(u, v),$$

$$= \mathfrak{I}\{2A_R A_O(x, y) e^{-j\phi(x,y)}\}$$

where $W_B(u,v)$ is a low-pass filter, (u,v) are the frequency variables, and the exponential function performs the shift of the side-band structure from ($\theta_x/\lambda$, $\theta_y/\lambda$) to the origin, (0,0).

This is shown in FIGS. 2A and 2B, where FIG. 2A represents the magnitude of the full frequency spectrum of a hologram and FIG. 2B represents the centered and low-pass filtered side-band structure containing the complex wavefront estimate required to determine $A_O(x,y)$ and $\phi(x,y)$.

The result of the shift and filtering operation is the approximate determination of the original complex wavefront, i.e., $$U_F(x,y)=2\mu A_O(x,y)e^{-j\phi(x,y)} \approx U_O(x,y)$$

Once an estimate of the original complex wavefront, $U_F(x,y)$, has been determined, the amplitude and phase can be determined as, $$A_O(x, y) = \sqrt{\text{Re}\{U_F(x, y)\}^2 + \text{Im}\{U_F(x, y)\}^2}$$

and $$\phi(x, y) = \tan^{-1}\left(\frac{\text{Re}\{U_F(x, y)\}}{\text{Im}\{U_F(x, y)\}}\right),$$

where Re{•} and Im {•} represent the real and imaginary components of $U_F(x,y)$ respectively.

FIG. 3A shows the resulting amplitude, $A_R(x,y)$ and FIG. 3B shows the phase, $\phi(x,y)$ from the SHH of the chrome-on-glass target used to obtain FIGS. 1A and 1B.

To this point of this overview description, two wavefronts, a reference wavefront and an object wavefront, have been mixed together to generate a spatial-heterodyne hologram on the surface of an imager, recorded, stored and then Fourier analyzed to recover the amplitude and phase of the object wavefront. It is important to note that the object wavefront can be the result of a wavefront transmitted through the object of interest, and not just a wavefront reflected from the surface of the object of interest. In each of these two cases, the information contained in the recovered amplitude and phase of the object wavefront provides useful, and different, information about the object of interest.

The following description emphasizes transmitted object wavefronts. A wave that passes through an object has its amplitude modified by the reflectivity of all the surfaces passed through and the absorption of the material. For this description, we will assume transparent materials such that absorption is negligible. By using the Fresnel equations, the reflectivity when passing from one medium to another for normal illumination can be calculated as $$R = \left(\frac{N_2 - N_1}{N_2 + N_1}\right)^2$$

where R is the reflectivity, and $N_1$ and $N_2$ are the indices of refraction for the materials on each side of the surface. For illumination at an angle, $$R = \left(\frac{\frac{N_1}{\mu_1}\cos\theta - \frac{N_2}{\mu_2}\cos\theta'}{\frac{N_1}{\mu_1}\cos\theta + \frac{N_2}{\mu_2}\cos\theta'}\right)^2$$

where $\theta$=angle from normal incidence, $\theta'$=angle from normal in second medium, and $\mu_1, \mu_2$ are the magnetic permeability of the materials on each side of the surface. From the reflectivity, the percent transmission can be calculated as T=1−R While the amplitude of such a transmitted object wavefront can provide information about the object of interest, the amplitude can be determined without using interferometry. More importantly, the interesting information that can be provided by such a transmitted object wavefront (via the analysis of the corresponding SHH) is the phase of the object wavefront. It is important to note that the phase of a transmitted object wavefront contains information about the thickness and the indices of refraction for the materials that the object comprises and through which the transmitted object wavefront passed. The index of refraction is the ratio of the speed of light in a vacuum (c) to the speed of light in a material (v) as given by $$N = \frac{c}{v}.$$

The time (t) required for a wave to pass through an object of width (d) is $$t = \frac{d}{v};$$

therefore, the phase difference ($\Delta\theta$) between the wavefront entering the material and exiting the material can be calculated as $$\Delta\theta = 2\pi t \frac{c}{\lambda} = 2\pi \left(\frac{d}{v}\right)\left(\frac{c}{\lambda}\right) = 2\pi d \left(\frac{c}{v}\right)\left(\frac{1}{\lambda}\right) = 2\pi dN/\lambda$$

where $\lambda$ is the wavelength of the illumination wavefront. Therefore, it can be appreciated that the phase portion of the object wavefront contains information about the thickness and the index of refraction of the object of interest.

Figure 4B:
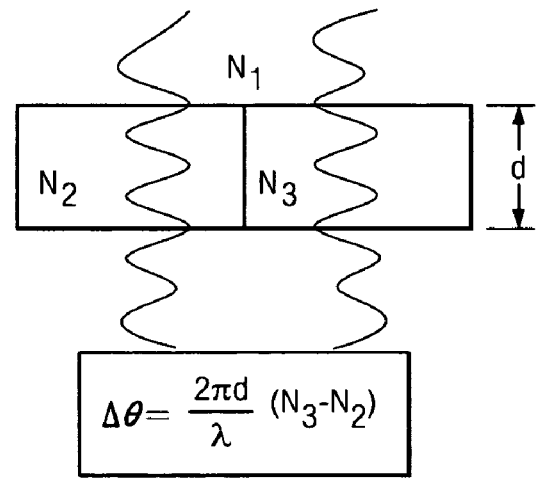
Figure 4C:
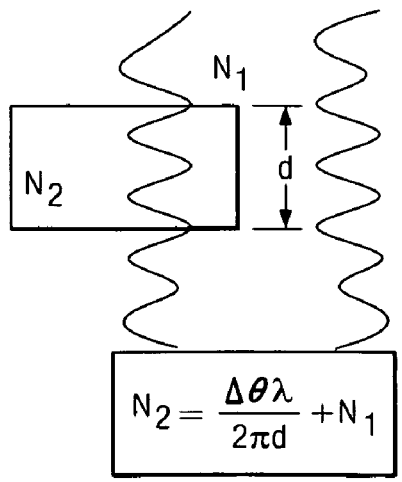

FIGS. 4A–4C show three specific measurements that can be made using the reconstructed phase information from a transmission SHH. Of course, the invention is not limited to the exemplary measurements depicted in FIGS. 4A–4C.

FIG. 4A shows a wavefront passing through the object at locations with two different thicknesses. The equation below FIG. 4A indicates that this difference in thickness can be calculated from the phase difference if the indices of refraction for the object and ambient material are known. The ambient material can be a layer of material or a surrounding material (matrix material) that is at least partially translucent (e.g., polymerized photoresist), a partial vacuum (e.g., ultra-high vacuum) or even air. Specifically, the invention can include calculating a difference in thickness ($\delta \delta$) between a first through section of the object and a second through section of the object as $$\delta = \frac{\Delta\theta\lambda}{2\pi(N_2 - N_1)}$$

where $\Delta\theta$ is a phase difference, $\lambda$ is a wavelength of a source of coherent light energy, $N_1$ is an ambient index of refraction and $N_2$ is an index of refraction of the object.

FIG. 4B shows an example where the change in phase can be used to distinguish between two materials of the same thickness. The equation below FIG. 4B allows the expected phase difference between the two materials to be calculated to help determine the expected contrast between the two materials in the phase image. Specifically, the invention can include calculating a phase difference ($\Delta\theta$) between a first portion of the object and a second portion of the object as $$\Delta\theta = \frac{2\pi d}{\lambda}(N_3 - N_2)$$

where d is a thickness of both the first portion of the object and the second portion of the object, $\lambda$ is a wavelength of a source of coherent light energy, $N_2$ is an index of refraction of the first portion of the object and $N_3$ is an index of refraction of the second portion of the object.

FIG. 4C graphically shows the ability to determine the index of refraction for a material using a sample of known thickness. The equation below FIG. 4C allows the index of refraction to be calculated. Specifically the invention can include calculating an index of refraction ($N_2$) characterizing a portion of the object as $$N_2 = \frac{\Delta\theta\lambda}{2\pi d} + N_1$$

where $\Delta\theta$ is a phase difference, $\lambda$ is a wavelength of a source of coherent light energy and $N_1$ is an ambient index of refraction.

The invention can include methods of obtaining high-speed transmissive spatial-heterodyne interferometric measurements of objects that are at least partially translucent with respect to a planar cross-section. The invention can include apparatus that produces high-speed transmissive spatial-heterodyne interferometric measurements of objects that are at least partially translucent with respect to a planar cross-section. This embodiment of the invention is described in detail as example set 1 below.

The invention can include combination methods of obtaining high-speed transmission measurements and obtaining high-speed reflection measurements using spatial-heterodyne interferometry for complete inspection/metrology of objects that are at least partially translucent with respect to a planar cross-section. The invention can include apparatus that produces high-speed transmission measurements and obtaining high-speed reflection measurements using spatial-heterodyne interferometry for complete inspection/metrology of objects that are at least partially translucent with respect to a planar cross-section, optionally simultaneously. This embodiment of the invention is described in detail as example set 2 below.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example Set 1

The invention can include a method for measuring (in a single high-speed digital image capture) the complex wavefront of an electromagnetic wave after it passes through an at least partially translucent material, using Spatial-Heterodyne Interferometry (SHI). Measuring the complex wavefront gives the absorption and phase shift incurred by the electromagnetic wave while passing through the object material. Spatial-Heterodyne Interferometry For Transmission (SHIFT) measurements use a small angle between the object beam and the reference to create a set of linear fringes that spatially heterodynes the transmitted wavefront. The inventors have realized the importance of the measurement of transmitted complex-wavefronts for objects such as translucent materials, lithography masks, and biological samples. In contrast to traditional phase shift interferometry, spatial-heterodyne interferometry for transmission (SHIFT) measurements allow high speed reconstruction of the measured wavefront by capturing the entire complex wavefront in a single digital image. SHIFT is able to make millions of phase measurements (pixelating an area) in a single high speed digital image capture and reconstruction. Also, SHIFT measures the entire complex-wavefront providing amplitude data as well as phase data. This reconstruction can be performed on a desktop computer in a fraction of a second and can be much faster than that when embodied as a hardware algorithm implementation. In the biological microscopy arena, many biological specimens have a low reflectance but their indices of refraction vary greatly between key elements of the specimen. When transmitting through these specimens, the various indices of refraction create different phase changes on the transmitted wavefront. Due to the direct measurement of phase by SHIFT, it is well suited for biological samples. If the materials that comprise an object of interest are translucent or transmissive for the illuminating wavelength, the transmissivity of the material is contained in the intensity of the transmitted wave, and a combination of material thickness and index of refraction are contained in the phase of the transmitted wave. Spatial-Heterodyne Interferometry For Transmission (SHIFT) has been developed to capture transmitted complex wavefronts. The reference and object waves are combined at a small angle on the imager surface to create the spatially-heterodyned hologram (SHH) image of the complex wave. This single image is then manipulated with Fourier analysis Voelkl (1999) to reconstruct the phase and intensity of the complex wavefront.

FIGS. 5A–5D depict several examples of the affect of material thickness and index of refraction on the transmitted object wavefront and, therefore, some of the properties can be inspected or measured by SHIFT. For clarity, it is assumed that all of the materials are purely transmissive such that the intensity of the transmitted image is the same as the illumination intensity.

Figure 5A:
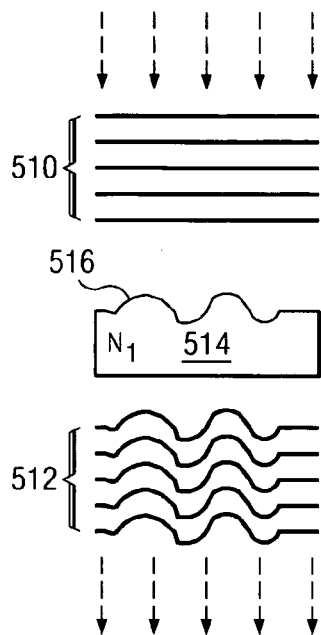
FIGS. 5A–5D illustrate schematic views of the transformation of illumination wave to transmitted wave effected by four different objects, representing embodiments of the invention.
Figure 5B:
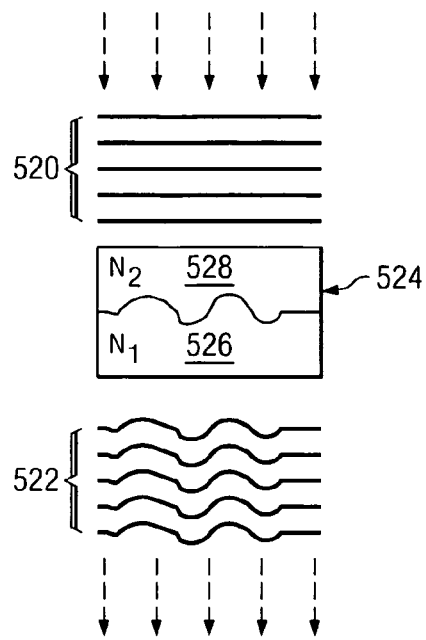
Figure 5C:
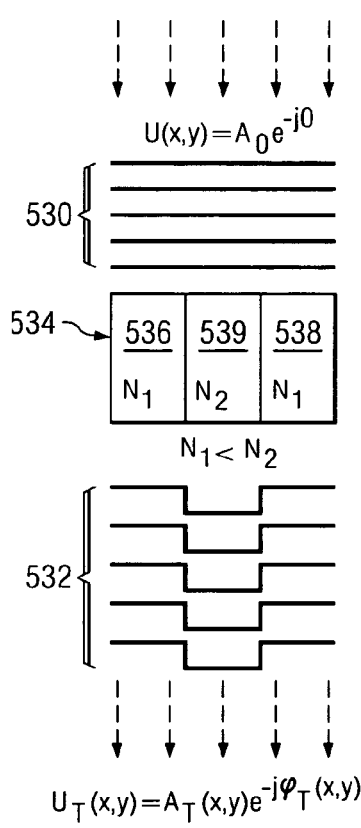
Figure 5D:
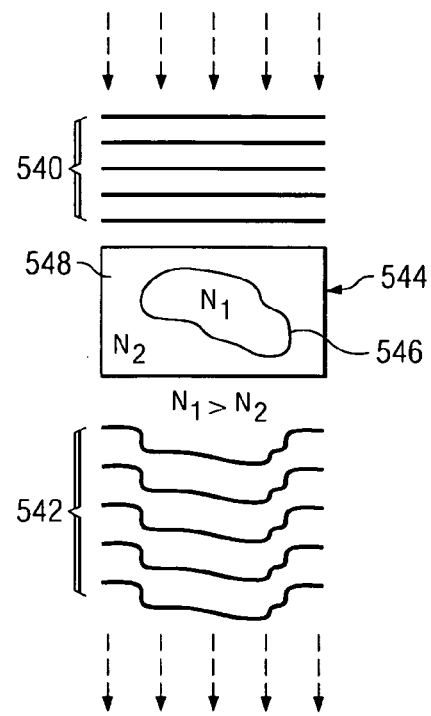

FIG. 5A shows the transformation of an illumination wave 510 to a transmitted wave 512 by an object 514 having a surface topology 516 with a single refractive index $N_1$. FIG. 5A shows the transmission wavefront provides a measure of thickness change. FIG. 5B shows the transformation of an illumination wave 520 to a transmitted wave 522 by a layered object 524 with two coextensive layers 526, 528 having two different refractive indexes $N_1$ and $N_2$, respectively. FIG. 5B shows that an interface between two materials, that is inaccessible for any surface scan measurement, can be measured and/or inspected using the transmitted wavefront. FIG. 5C shows the transformation of an illumination wave 530 (along with an equation representing a general form of an illumination wave) to a transmitted wave 532 (together with an equation representing a general form of a transmitted wave) by a segmented object 534 with two regions 536, 538 of one refractive index $N_1$ and a single region 539 with a second refractive index $N_2$. FIG. 5C shows that two materials with different indices of refraction become visible in a phase image. FIG. 5D shows the transformation of an illumination wave 540 to a transmitted wave 542 by a composite object 544 having a portion 546 with a first refractive index $N_1$ embedded in a matrix 538 with a second refractive index $N_2$. FIG. 5D shows that a material change internal to the imaged object is visible in a single transmission phase image. If this internal material change is a pure phase object, the material change is invisible to intensity images which is common in biological microscopy samples.

Figure 6:
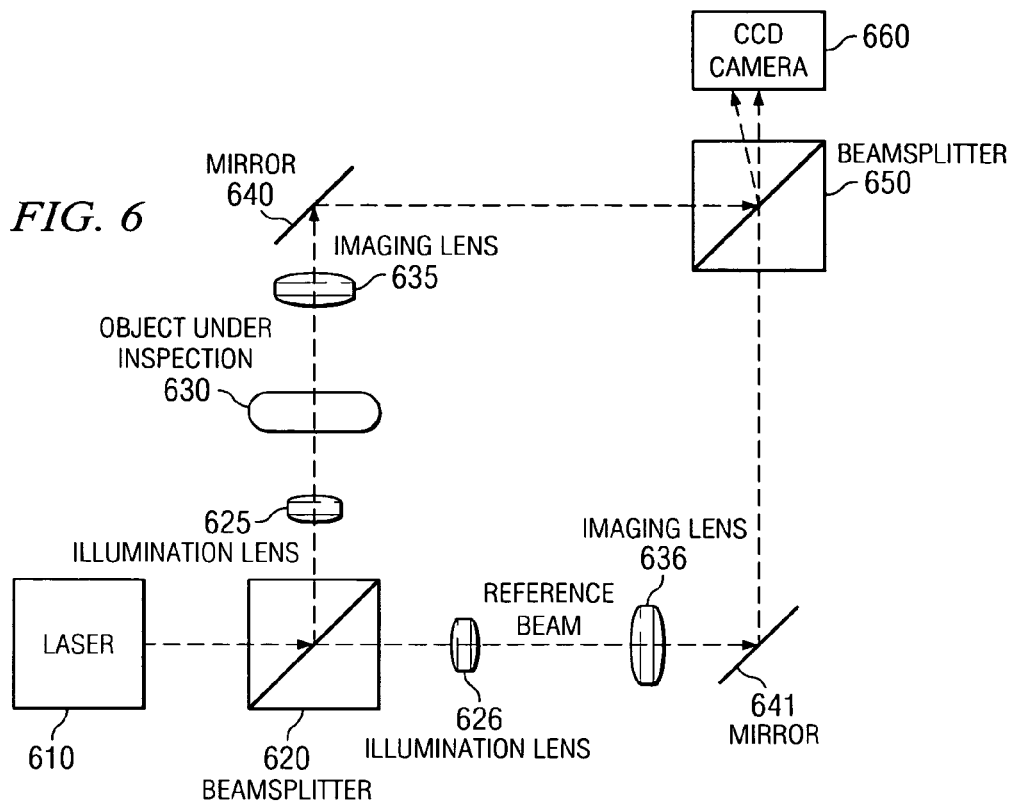
FIG. 6 illustrates a schematic view of a first basic optical design for spatial-heterodyne interferometry for transmission, representing an embodiment of the invention.
Figure 7:
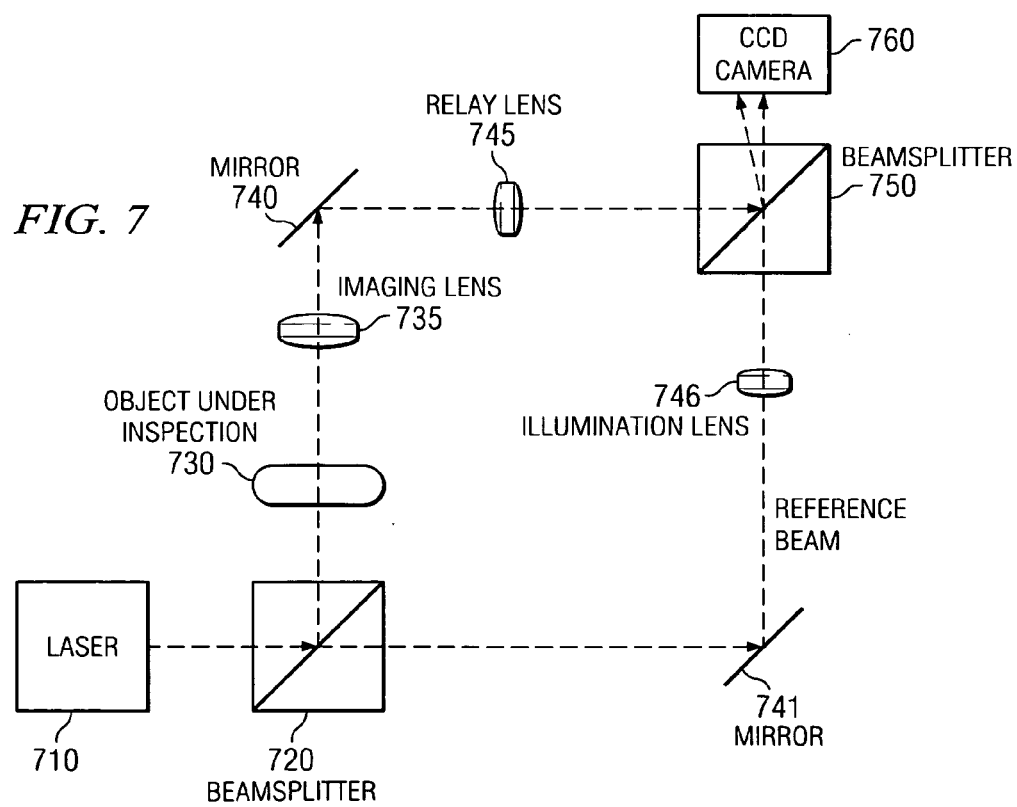
FIG. 7 illustrates a schematic view of a second basic optical design for spatial-heterodyne interferometry for transmission, representing an embodiment of the invention.

FIGS. 6 and 7 show two basic optical designs for spatial-heterodyne interferometry for transmission. Of course, the invention is not limited to these two embodiments.

Referring to FIG. 6, a first implementation of a transmission measurement system using spatial-heterodyne Interferometry is depicted. A laser 610 is optically coupled to a first beamsplitter 620. The first beamsplitter 620 is optically coupled to a first illumination lens 625. The first illumination lens 625, is optically coupled to an object under inspection 630. The object under inspection 630 is optically coupled to a first imaging lens 635. The first imaging lens 635 is optically coupled to a first mirror 640. Of the first mirror 640 is optically coupled to a second beamsplitter 650. The first beamsplitter 620 is also optically coupled to a second illumination lens 626. The second illumination lens 626 is optically coupled to a second imaging lens 636. The second imaging lens 636 is optically coupled to a second mirror 641. The second mirror 641 is optically coupled to the second beamsplitter 650. A charge coupled device camera 660 is optically coupled to the second beamsplitter 650. Note that the object arm optics are reproduced in the reference arm so that the object arm and reference arm wavefronts are matched at the CCD.

FIG. 6 depicts a generic SHIFT geometry in which the object and reference beams are matched. The laser beam is split into two parts by the first beamsplitter. Both beams pass through illumination lenses. The object beam than passes through the object under inspection, while the reference beam continues on without encountering an object. In this circumstance, the object under inspection is being compared to free space; however, the reference could be any object or material to which the object under inspection is to be compared. The imaging lenses then collect the object and reference beams and pass them onto the CCD camera. A beamsplitter located in front of the CCD combined the object and reference beams, and imparts a small angular difference between them to generate the spatial-heterodyne fringes.

Referring to FIG. 7, a second implementation of a transmission measurement system using spatial-heterodyne Interferometry is depicted. A laser 710 is optically coupled to a first beamsplitter 720. The first beamsplitter 720 is optically coupled to an object under inspection 730. The object under inspection 730 is optically coupled to an imaging lens 735. The imaging lens 735 is optically coupled to a first mirror 740. The first mirror 740 is optically coupled to a relay lens 745. The relay lens 745 is optically coupled to a second beamsplitter 750. The first beamsplitter 720 is also optically coupled to a second mirror 741. The second mirror 741 is optically coupled to an illumination lens 746. The illumination lens 746 is optically coupled to the second beamsplitter 750. A charge coupled device camera 760 is optically coupled to the second beamsplitter 750. Note, in this implementation a simplified optics path is used. Rather than matching the object arm optics in the reference arm, the illumination lens in the reference arm is selected to match the wavefront with the object arm at the CCD.

FIG. 7 depicts a simplified transmission geometry in which the object and reference beams have unmatched optics paths, but the illumination lens in the reference arm is used to match the object beam and reference beam wavefronts at the CCD. Any mismatch in the two wave fronts is constant. As long as this mismatch is kept small enough to still allow the image to be contained in the required region of the frequency domain, the mismatch can be removed through image processing.

Example Set 2

The invention can include a method and apparatus for acquiring both the reflected and transmitted complex wavefronts of an electromagnetic wave incident on a translucent material for complete inspection/metrology of the material using Spatial-Heterodyne Interferometry (SHI). It also includes a method and apparatus for measuring and combining the transmitted and reflected complex wavefronts simultaneously. When an electromagnetic wave (as from a laser) is incident on a translucent object surface, a portion of the wave energy is transmitted into the material and a portion is reflected from the material surface. A system which can acquire the complex wavefronts for both the transmitted and reflected waves can be used to analyze and inspect both.

Spatial-heterodyne interferometry for reflection and transmission (SHIRT) measurements use the small angle interference to create an interference pattern; however, the method and apparatus have been modified to capture both the transmitted wavefront after it passes through the object being imaged and the reflected wavefront. Capturing both wavefronts in two simultaneous digital images (or even in one image) allows for high-speed surface and volumetric inspection of translucent objects. Measuring and combining both transmission and reflection to fully characterize a translucent object is extremely valuable for inspecting lithography masks where there are both (opaque) surface features and thickness or material variations. Another application is examining biological samples where the only information imparted to the wavefronts is due to variations in the index of refraction. Measuring both the phase shift of the transmitted wave and the phase shift of the reflected wave (reflections will occur at every surface between two materials with different index of refractions) will enhance the ability to image and characterize features in the sample.

Since we are using the spatial-frequency of the fringes to heterodyne the wave information, we call this 'spatial-heterodyning'. We call the imaged complex wavefront a 'hologram', and therefore, the recorded wavefront is a 'spatially-heterodyned hologram' or SHH. If the materials being imaged are translucent or transmissive for the illuminating wavelength, the transmissivity of the material is contained in the intensity of the transmitted wave, and a combination of material thickness and index of refraction are contained in the phase of the transmitted wave. The reflected wave contains the information on the surface topology of the material, as well as information from reflections occurring within the material (at boundaries between materials of different indexes of refraction). Therefore, capturing both the reflected and transmitted complex waves provides a more complete characterization of the object being inspected and an apparatus and method for capturing complex wavefronts for both the reflected wave and the transmitted wave is needed. Spatial-Heterodyne Interferometry for Reflection and Transmission (SHIRT) can capture, simultaneously, both the reflected and the transmitted complex wavefronts.

Figure 8A:
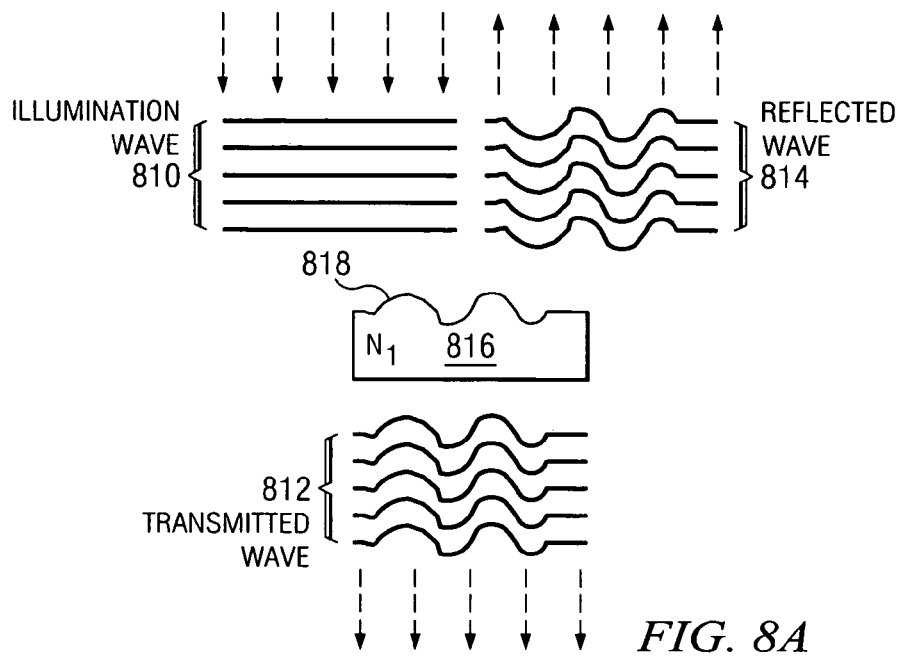
FIGS. 8A–8B illustrate schematic views of the transformation of illumination wave to both transmitted wave and reflected wave for two different objects, representing embodiments of the invention.
Figure 8B:
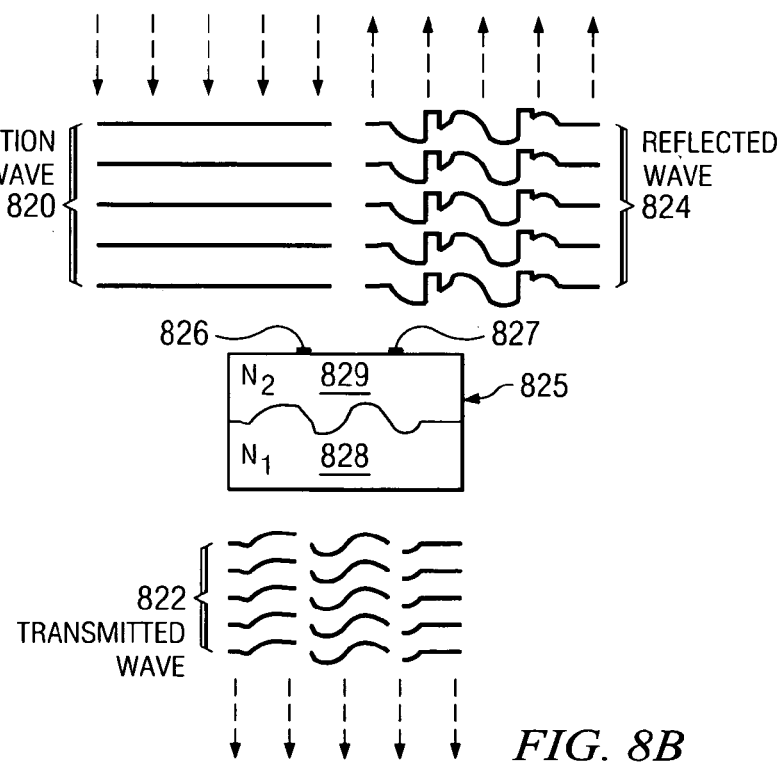

FIGS. 8A–8B depict examples of the affect of surface features, material thickness and index of refraction on the transmitted and reflected wavefronts from an object and, therefore, some of the properties can be inspected or measured by SHIRT. FIG. 8A shows the transformation of an illumination wave 810 to both a transmitted wave 512 and a reflected wave 814 by an object 816 having a surface topology 818 with a single refractive index $N_1$. FIG. 8B shows the transformation of an illumination wave 520 to both a transmitted wave 822 and a reflected wave 824 by a layered object 825 with two opaque surface features 826,827 and two coextensive layers 828, 829 having two different refractive indexes $N_1$ and $N_2$, respectively.

Once the transmitted and reflected signals have been obtained for a semi-transparent object, the method for using this more complete representation of the object will vary with the application. For example, in a biological sample some parts of the specimen may be highly reflective and show up well in the intensity of the reflected wavefront and other parts will be very visible in the phase of the transmitted wavefront due to index of refraction variations. By normalizing these two images and fusing (addition, multiplication, etc.) them together, a more detailed image of the specimen can be developed. For metrology of photolithography masks, the reflected wavefront provides height information of surface features especially on opaque (chrome) regions while the transmission image provides a direct measure of phase shift through the mask which is crucial for high resolution masks. If phase shift on the mask is produced by surface etching, reflection also provides an indirect measure of the phase shift created by the mask if the mask materials are known. In this case, transmission and reflection both provide a measure of phase shift and this redundancy will reduce measurement noise and provide improved confidence. For metrology of transparent films, the reflective wavefronts can be used to measure surface variations and flexure in the material while transmission provides a measure of material thickness and/or index of refraction. Regardless of the measurement scenario, the combined reflective and transmissive method guarantees a contiguous characterization of the surface and internal features of an object under test.

Figure 9:
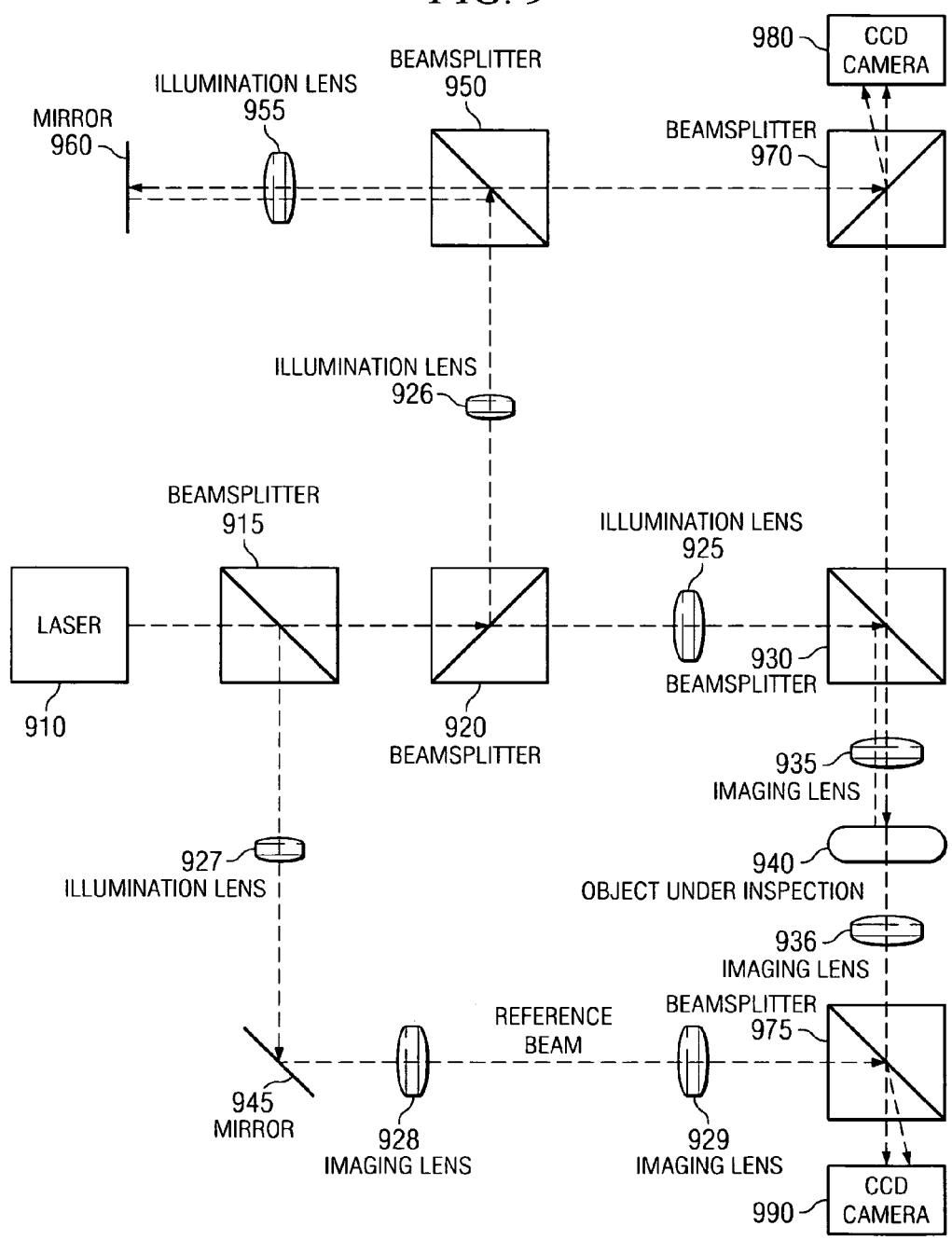
FIG. 9 illustrates a schematic view of a first basic optical design for spatial-heterodyne interferometry for reflection and transmission, representing an embodiment of the invention.
Figure 10:
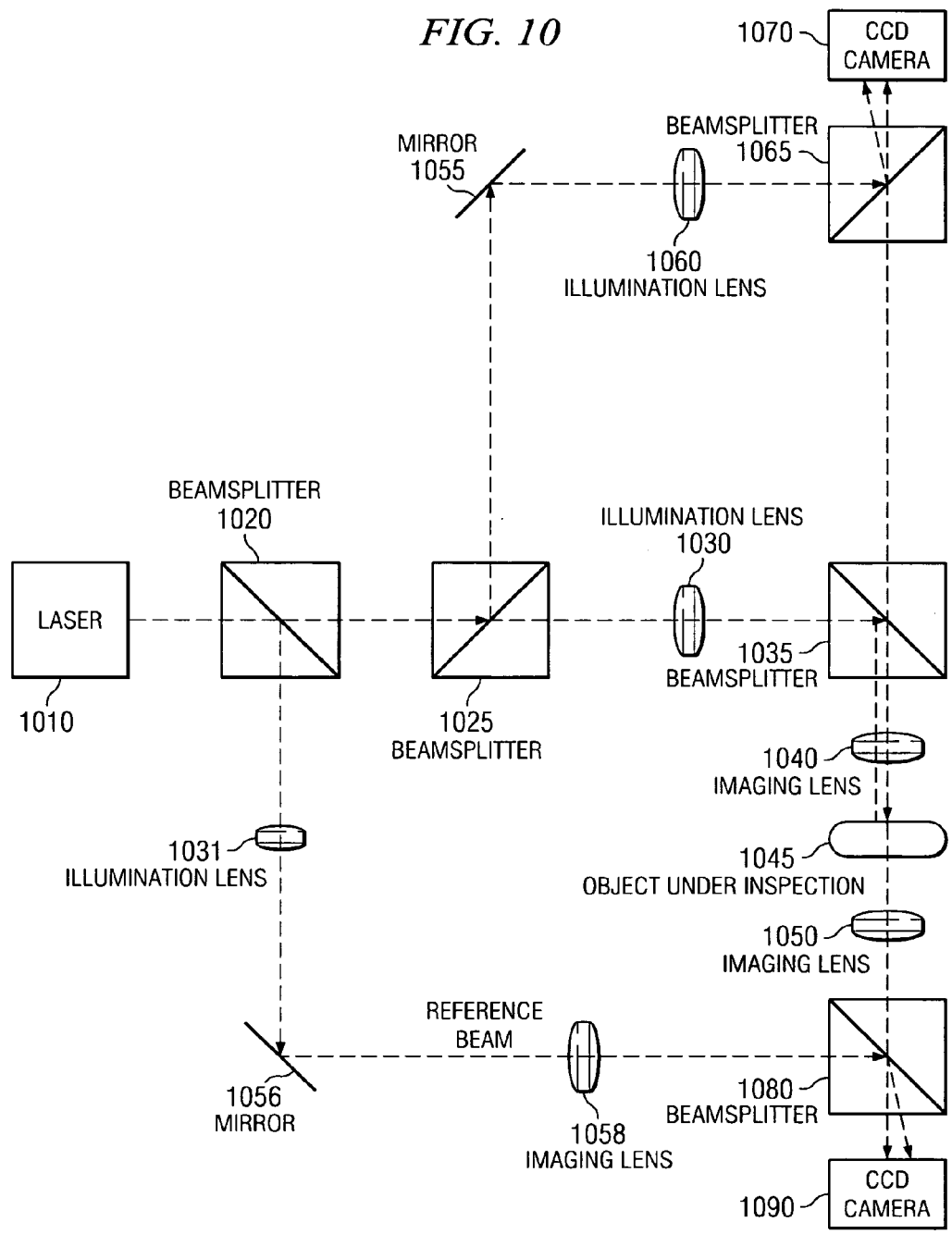
FIG. 10 illustrates a schematic view of a second basic optical design for spatial-heterodyne interferometry for reflection and transmission, representing an embodiment of the invention.

FIGS. 9 and 10 show two basic optical designs for spatial-heterodyne interferometry for reflection and transmission. Of course, the invention is not limited to these embodiments.

Referring to FIG. 9, a first implementation of a transmission/reflection measurement system using spatial-heterodyne Interferometry is depicted. A laser 910 is optically coupled to a first beamsplitter 915. The first beamsplitter 915 is optically coupled to a second beamsplitter 920. The second beamsplitter 920 is optically coupled to a first illumination lens 925. The first illumination lens 925 is optically coupled to a third beamsplitter 930. The third beamsplitter 930 is optically coupled to a first imaging lens 935. The first imaging lens 935 is optically coupled to an object under inspection 940. The second beamsplitter 920 is also optically coupled to a second illumination lens 926. The second illumination lens 926 is optically coupled to a fourth beamsplitter 950. The fourth beamsplitter 950 is optically coupled to a second imaging lens 955. The second imaging lens 955 is optically coupled to a reference mirror 960. The fourth beamsplitter 950 is also optically coupled to a fifth beamsplitter 970. A charge coupled device camera 980 is optically coupled to the fifth beamsplitter 970. The first beamsplitter 915 is also optically coupled to a third illumination lens 927. The third illumination lens 927 is optically coupled to a mirror 945. The mirror 945 is optically coupled to a fourth illumination lens 928. The fourth illumination lens 928 is optically coupled to a fifth illumination lens 929. The fifth illumination lens 929 is optically coupled to a sixth beamsplitter 975. The object under inspection 940 is optically coupled to a second imaging lens 936. The second imaging lens 936 is optically coupled to the sixth beamsplitter 975. Another charge coupled device camera 990 is optically coupled to the sixth beam splitter 975. Note that the object arm optics are reproduced in the reference arm so that the object arm that the object arm optics are reproduced in the reference arm so that the object arm and reference arm wavefronts are matched at the CCD.

FIG. 9 shows a generic SHIRT geometry in which the object and reference beams are matched. The first beamsplitter 915 splits off a portion of the laser beam to create the transmitted wave reference beam. The second beamsplitter 920 splits off a portion of the laser beam to create the reflected wave reference beam. The third beamsplitter 930 directs the object illumination beam through the imaging lens and onto the object. The reflected portion of the illumination wave becomes the reflected object beam and is conveyed to the CCD camera 980 via the third beamsplitter 930 and the fifth beamsplitter 970. The reflected wave reference beam is incident on the reference mirror via the fourth beamsplitter 950, and then is combined by the fifth beamsplitter 970 with the reflected object beam at a small angular difference that is created by the orientation of the fifth beamsplitter 970. The reflected object beam and reference beam then interfere on the CCD camera 980 to create the reflected wave SHH. The portion of the illumination wave which passes through the object becomes the transmitted object beam and is collected by the second imaging lens and conveyed to the CCD camera 990 by the sixth beamsplitter 975. The reference beam created by the first beamsplitter 915 passes through a similar optical path to the transmitted object beam and is combined with the transmitted object wave by the sixth beamsplitter 975. A small angular difference is imparted to the two beams by the orientation of the sixth beamsplitter 975 so that when they interfere on the CCD camera 990 a SHH is created. If the reference object is not to be air or 'vacuum', then the reference object can be inserted between the two illumination lenses in the reference arm.

FIG. 10 depicts a second implementation of a transmission/reflection measurement system using spatial-heterodyne interferometry. A laser 1010 is optically coupled to a first beamsplitter 1020. The first beamsplitter 1020 is optically coupled to a second beamsplitter 1025. The second beamsplitter 1025 is optically coupled to a first illumination lens 1030. The first illumination lens 1030 is optically coupled to a third lens 1040. The first imaging lens 1040 is optically coupled to an object under inspection 1045. The object under inspection 1045 is optically coupled to a second imaging lens 1050. The second beamsplitter 1025 is optically coupled to a first mirror 1055. The first mirror 1055 is optically coupled to a second illumination lens 1060. The second illumination lens 1060 is optically coupled to a fourth beamsplitter 1065. The fourth beamsplitter 1065 is optically coupled to a first charge coupled device camera 1070. The first beamsplitter 1020 is also optically coupled to a third illumination lens 1031. The third illumination lens 1031 is optically coupled to a second mirror 1056. The second mirror 1056 is optically coupled to a fourth illumination lens 1058. The fourth illumination lens 1058 and the second imaging lens 1050 are both optically coupled to a fifth beamsplitter 1080. The fifth beamsplitter 1080 is optically coupled to a second charge coupled device camera 1090. Note, in this implementation a simplified optics path is used. Rather than matching the object arm optics in the reference arm, the illumination lens in the reference arm is selected to match wavefront with the object arm at the CCD.

FIG. 10 shows a simplified transmission geometry in which the object and reference beams have unmatched optics paths, but the illumination lenses 1031, 1058, 1060 in the reference arms are used to match beam wavefronts at the CCD cameras 1070, 1090. Any mismatch in the two wavefronts is constant. As long as this mismatch is kept small enough to still allow the image to be contained in the required region of the frequency domain, the mismatch can be removed through image processing.

A possible alternative to the method and apparatus discussed above is to record both the reflected wavefront and the transmitted wavefront holograms on one CCD image by recording each with a different spatial-heterodyne frequency defined by two different small angles between two corresponding sets of object and reference beams. The optics system can be designed to allow the reflected wavefront and the transmitted wavefront to be conveyed to the same CCD. Additionally, the reference beams for each of these would be conveyed to the CCD with the ability to vary the angle of incidence between each object beam and its reference beam. For instance, the two beamsplitters that function as combiners can both be optically coupled to a single additional beamsplitter that routes both pairs of beams to the same CCD. The two spatially-heterodyned holograms can then be recorded simultaneously on the same CCD at different spatial-heterodyne frequencies. It is advantageous that the reflective reference beam and the reflective object beam that define the reflective reference beam-object beam angle are not coherent with respect to the transmissive reference beam and the transmissive object beam that define the transmissive reference beam-object beam angle. In any event, this single CCD alternative has the advantage of significantly reducing the computational requirements for analyzing the two holograms. The techniques of recording multiple spatially-heterodyned holograms in one digital image are described in more detail in U.S. Ser. Nos. 10/421,444; 10/607,824; and/or 10/607,840.

Practical Applications of the Invention

Practical applications of spatial-heterodyne interferometry for transmission (SHIFT) include: metrology and inspection of photolithographic masks; biological microscopy; measurement of index of refraction; and thickness measurement on transmissive objects. Practical applications of spatial-heterodyne interferometry for reflection and transmission (SHIRT) include: metrology and inspection of photolithographic masks; biological microscopy; and simultaneous measurement of index of refraction, thickness and surface features of a translucent object. There are virtually innumerable uses for the invention, all of which need not be detailed here.

Advantages of the Invention

Spatial-heterodyned interferometry for transmission (SHIFT), representing an embodiment of the invention, can be cost effective and advantageous for at least the following reasons. Spatial-heterodyned interferometry for transmission allows capture of the complex wavefront transmitted through an object. Spatial-heterodyned interferometry for transmission allows high speed collection of the complex transmission wavefront due to the fact that only a single image is required. Spatial-heterodyned interferometry for transmission allows measurement of phase variations through materials (nonuniformities, impurities, material changes, etc.).

Spatial-heterodyned interferometry for reflection and transmission (SHIRT), representing an embodiment of the invention, can be cost effective and advantageous for at least the following reasons. Spatial-heterodyned interferometry for reflection and transmission allows simultaneous capture of the complex wavefront transmitted through an object and the complex wavefront reflected from the object surface. The invention improves quality and/or reduces costs compared to previous approaches.

The terms a or an, as used herein, are defined as one or more than one. The term plurality, as used herein, is defined as two or more than two. The term another, as used herein, is defined as at least a second or more. The terms "comprising" (comprises, comprised), "including" (includes, included) and/or "having" (has, had), as used herein, are defined as open language (i.e., requiring what is thereafter recited, but open for the inclusion of unspecified procedure(s), structure(s) and/or ingredient(s) even in major amounts. The terms "consisting" (consists, consisted) and/or "composing" (composes, composed), as used herein, close the recited method, apparatus or composition to the inclusion of procedures, structure(s) and/or ingredient(s) other than those recited except for ancillaries, adjuncts and/or impurities ordinarily associated therewith. The recital of the term "essentially" along with the terms "consisting" or "composing" renders the recited method, apparatus and/or composition open only for the inclusion of unspecified procedure(s), structure(s) and/or ingredient(s) which do not materially affect the basic novel characteristics of the composition. The term coupled, as used herein, is defined as connected, although not necessarily directly, and not necessarily mechanically. The term approximately, as used herein, is defined as at least close to a given value (e.g., preferably within 10% of, more preferably within 1% of, and most preferably within 0.1% of). The term substantially, as used herein, is defined as largely but not necessarily wholly that which is specified. The term generally, as used herein, is defined as at least approaching a given state. The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a serylet, a source code, an object code, a shared library/dynamic load library and/or other sequence of instructions designed for execution on a computer or computer system.

All the disclosed embodiments of the invention disclosed herein can be made and used without undue experimentation in light of the disclosure. The invention is not limited by theoretical statements recited herein. Although the best mode of carrying out the invention contemplated by the inventor(s) is disclosed, practice of the invention is not limited thereto. Accordingly, it will be appreciated by those skilled in the art that the invention may be practiced otherwise than as specifically described herein.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

All the disclosed elements and features of each disclosed embodiment can be combined with, or substituted for, the disclosed elements and features of every other disclosed embodiment except where such elements or features are mutually exclusive. Variation may be made in the steps or in the sequence of steps composing methods described herein.

Although the interferometer described herein can be a separate module, it will be manifest that the interferometer may be integrated into the system (e.g., photolithographic inspection instrument) with which it is associated. The individual components need not be formed in the disclosed shapes, or combined in the disclosed configurations, but could be provided in virtually any shapes, and/or combined in virtually all configurations.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

E. Voelkl et al, "Introduction to Electron Holography", Kluwer Academics/Plenum Publishers, 1999, pages 133ff.

J. Jacob, T. Litvin, and A. Merriam, *High-Resolution Photomask Transmission and Phase Measurement Tool*, Metrology, Inspection, and Process Control for Microlithography XVI, SPIE Conference, Santa Clara, Calif., Mar. 4, 2002, Session 2 (Proceedings of SPIE Vol. #4689-10).

C. E. Thomas, et al, "Direct to Digital Holography for Semiconductor Wafer Defect Detection and Review", Proceedings of SPIE, Vol. 4692, pp. 180–194, 2002.

U.S. Pat. No. 6,078,392 issued Jun. 20, 2000, entitled "Direct-To-Digital Holography, Holographic Interferometry, and Holovision" to Clarence E. Thomas, Larry R. Baylor, Gregory R. Hanson, David A. Rasmussen, Edgar Voelkl, James Castracane, Michele Sumkulet and Lawrence Clow U.S. Pat. No. 6,525,821, issued Feb. 25, 2003, entitled "Acquisition and Replay Systems for Direct-to-Digital Holography and Holovision" to Clarence E. Thomas and Gregory R. Hanson.

What is claimed is:

1. A method, comprising:
digitally recording a first spatially-heterodyned hologram including spatial heterodyne fringes for Fourier analysis using a first reference beam and a first object beam;
digitally recording a second spatially-heterodyned hologram including spatial heterodyne fringes for Fourier analysis using a second reference beam and a second object beam;
Fourier analyzing the digitally recorded first spatially-heterodyned hologram, by shifting a first original origin of the digitally recorded first spatially-heterodyned hologram to sit on top of a first spatial-heterodyne carrier frequency defined by a first angle between the first reference beam and the first object beam, to define a first analyzed image;
Fourier analyzing the digitally recorded second spatially-heterodyned hologram, by shifting a second original origin of the digitally recorded second spatially-heterodyned hologram to sit on top of a second spatial-heterodyne carrier frequency defined by a second angle between the second reference beam and the second object beam, to define a second analyzed image;
digitally filtering the first analyzed image to cut off signals around the first original origin to define a first result; and
digitally filtering the second analyzed image to cut off signals around the second original origin to define a second result;
performing a first inverse Fourier transform on the first result, and
performing a second inverse Fourier transform on the second result,
wherein the first object beam is transmitted through an object that is at least partially translucent and the second object beam is reflected from the object.

2. The method of claim 1, wherein a first digital image includes the first spatially-heterodyned hologram and a second digital image includes the second spatially heterodyned hologram.

3. The method of claim 1, wherein the first digital image is generated by a first pixilated detection device and the second digital image is generated by a second pixilated detection device.

4. The method of claim 1, wherein the first angle is not equal to the second angle and a single digital image includes both the first spatially-heterodyned hologram and the second spatially-heterodyned hologram.

5. The method of claim 4, wherein the both the first spatially-heterodyned hologram and the second spatially-heterodyned hologram are digitally recorded with a single pixilated detection device and the single digital image is generated by the single pixilated detection device.

6. The method of claim 5, wherein the first reference beam and the second object beam are not coherent with respect to the second reference beam and the second object beam.

7. The method of claim 6, wherein the spatial heterodyne fringes of the first spatially heterodyned hologram are substantially orthogonal with respect to the spatial heterodyne fringes of the second spatially-heterodyned hologram.

8. The method of claim 1, further comprising calculating a difference in thickness ($\delta$) between a first through section of the object and a second through section of the object as $$\delta = \frac{\Delta\theta\lambda}{2\pi(N_2 - N_1)}$$

where $\Delta\theta$ is a phase difference, $\lambda$ is a wavelength of a source of coherent light energy, $N_1$ is an ambient index of refraction and $N_2$ is an index of refraction of the object.

9. The method of claim 1, further comprising calculating a phase difference ($\Delta\theta$) between a first portion of the object and a second portion of the object as $$\Delta\theta = \frac{2\pi d}{\lambda}(N_3 - N_2)$$

where d is a thickness of both the first portion of the object and the second portion of the object, $\lambda$ is a wavelength of a source of coherent light energy, $N_2$ is an index of refraction of the first portion of the object and $N_3$ is an index of refraction of the second portion of the object.

10. The method of claim 1, further comprising calculating an index of refraction ($N_2$) characterizing a portion of the object as $$N_2 = \frac{\Delta\theta\lambda}{2\pi d} + N_1$$

where $\Delta\theta$ is a phase difference, $\lambda$ is a wavelength of a source of coherent light energy and $N_1$ is an ambient index of refraction.

11. The method of claim 1, further comprising moving the object within a plane that is substantially perpendicular to both an axis defined by the first object beam and an axis defined by the second object beam after digitally recording the first spatially-heterodyned hologram and after digitally recording the second spatially-heterodyned hologram.

12. The method of claim 11, further comprising digitally recording both a third spatially-heterodyned hologram and a fourth spatially heterodyned hologram after moving the object within the plane.

13. The method of claim 1, wherein the reference beam and the object beam are generated by a laser operating in pulse mode.

14. A photolithographic mask inspection process comprising the method of claim 1.

15. A metrology process comprising the method of claim 1.

16. An apparatus, comprising:
a source of coherent light energy;
a transmission reference beam subassembly optically coupled to the source of coherent light;
a reflection reference beam subassembly optically coupled to the source of coherent light;
an object beam subassembly optically coupled to the source of coherent light, the object beam subassembly including a transmission object beam path and a reflection object beam path;
a transmission beamsplitter optically coupled to both the transmission reference beam subassembly and the object beam subassembly;

a reflection beamsplitter optically coupled to both the reflection reference beam subassembly and the object beam subassembly; and a pixilated detection device optically coupled to at least one member selected from the group consisting of the transmission beamsplitter and the reflection beamsplitter, wherein the object beam subassembly includes an object that is at least partially translucent, the object i) transmissively optically coupled between the source of coherent light energy and the transmission beamsplitter and ii) reflectively optically coupled between the source of coherent light energy and the reflection beamsplitter.

17. The apparatus of claim 16, further comprising:

another transmission beamsplitter i) optically coupled between the source of coherent light energy and the transmission reference beam subassembly and ii) optically coupled between the source of coherent light energy and the object beam subassembly; and another reflection beamsplitter i) optically coupled between the source of coherent light energy and the reflection reference beam subassembly and ii) optically coupled between the source of coherent light energy and the object beam subassembly.

18. The apparatus of claim 16, wherein the transmission reference beam subassembly includes an illumination lens.

19. The apparatus of claim 16, wherein the reflection reference beam subassembly includes an illumination lens.

20. The apparatus of claim 16, wherein the reflection reference beam subassembly includes a reference mirror.

21. The apparatus of claim 16, wherein the object beam subassembly includes an imaging lens.

22. The apparatus of claim 16, wherein the object beam subassembly includes an illumination lens.

23. The apparatus of claim 16, further comprising another pixilated detection device optically coupled to one member selected from the group consisting of the transmission beamsplitter and the reflection beamsplitter.

24. The apparatus of claim 16, wherein the source of coherent light energy includes a laser operated in pulse mode.

25. A photolithographic mask inspection instrument comprising the apparatus of claim 16.

26. A metrology instrument comprising the apparatus of claim 16.

* * * * *